United States Patent
Kawasaki

(10) Patent No.: US 10,777,529 B2
(45) Date of Patent: Sep. 15, 2020

(54) SEMICONDUCTOR DEVICE AND METHOD FOR MANUFACTURING SAME

(71) Applicant: TOSHIBA MEMORY CORPORATION, Minato-ku (JP)

(72) Inventor: Kazushige Kawasaki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/121,186

(22) Filed: Sep. 4, 2018

(65) Prior Publication Data

US 2019/0295985 A1    Sep. 26, 2019

(30) Foreign Application Priority Data

Mar. 22, 2018   (JP) ................. 2018-055029

(51) Int. Cl.
| | |
|---|---|
| *H01L 25/065* | (2006.01) |
| *H01L 23/00* | (2006.01) |
| *H01L 25/18* | (2006.01) |
| *H01L 25/00* | (2006.01) |

(52) U.S. Cl.
CPC .......... *H01L 25/0652* (2013.01); *H01L 24/03* (2013.01); *H01L 24/09* (2013.01); *H01L 24/11* (2013.01); *H01L 24/17* (2013.01); *H01L 24/81* (2013.01); *H01L 25/18* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 8,264,068 B2 | 9/2012 | Wang et al. | |
| 9,721,935 B2 | 8/2017 | Kawasaki et al. | |
| 2010/0009491 A1 | 1/2010 | Yamada | |
| 2015/0162265 A1* | 6/2015 | Jo | ............ H01L 24/97 257/774 |
| 2015/0214207 A1 | 7/2015 | Yoshida | |

FOREIGN PATENT DOCUMENTS

| | | |
|---|---|---|
| JP | 2008-270367 | 11/2008 |
| JP | 2010-21266 | 1/2010 |
| JP | 2014-22395 | 2/2014 |
| JP | 2015-176958 | 10/2015 |

\* cited by examiner

*Primary Examiner* — Long Pham
(74) *Attorney, Agent, or Firm* — Oblon, McClelland, Maier & Neustadt, L.L.P.

(57) ABSTRACT

A semiconductor device includes a base member; a first stacked body including first semiconductor chips and second semiconductor chips stacked alternately in a first direction crossing a front surface of the base member; and a second stacked body arranged with the first stacked body in a second direction along the front surface of the base member. The second stacked body includes other first semiconductor chips and other second semiconductor chips stacked alternately in the first direction. The first stacked body includes a lowermost first semiconductor chip connected to the base member, and the second stacked body includes a lowermost second semiconductor chip connected to the base member.

20 Claims, 5 Drawing Sheets

– 1 –

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2018-055029, filed on Mar. 22, 2018; the entire contents of which are incorporated herein by reference.

FIELD

Embodiments relate to a semiconductor device and a method for manufacturing the same.

BACKGROUND

A semiconductor memory device is known, for instance, in which a plurality of semiconductor memory chips are stacked and resin-molded on a substrate. In such a semiconductor device, the number of chips stacked is increased for enlarging the memory capacity, resulting in the enlarged device size, and raising the manufacturing cost.

DETAILED DESCRIPTION

Figure 1A:
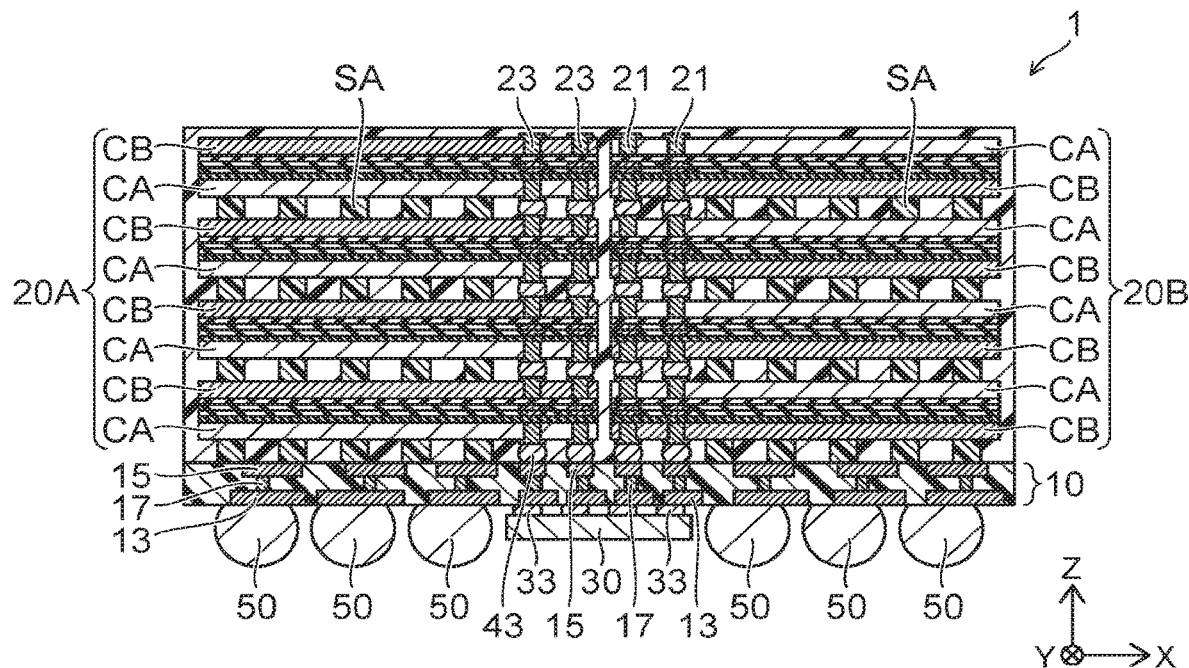
FIGS. 1A and 1B are schematic views showing a semiconductor device according to an embodiment.

According to one embodiment, a semiconductor device includes a base member; a first stacked body including first semiconductor chips and second semiconductor chips stacked alternately in a first direction crossing a front surface of the base member; and a second stacked body arranged with the first stacked body in a second direction along the front surface of the base member. The second stacked body includes other first semiconductor chips and other second semiconductor chips stacked alternately in the first direction. The first stacked body includes a lowermost first semiconductor chip connected to the base member, and the second stacked body includes a lowermost second semiconductor chip connected to the base member.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
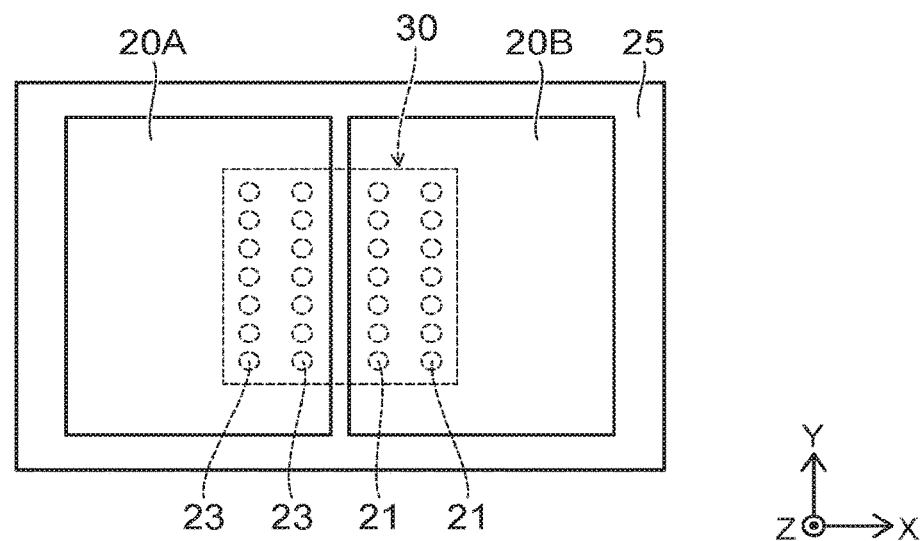

FIGS. 1A and 1B are schematic views showing a semiconductor device 1 according to an embodiment. FIG. 1A is a sectional view showing the structure of the semiconductor device 1. FIG. 1B is a schematic plan view showing the upper surface of the semiconductor device 1.

The semiconductor device 1 is e.g. a nonvolatile memory device with the large memory capacity. The semiconductor device 1 includes a base member 10, a stacked body 20A, and a stacked body 20B. The stacked bodies 20A and 20B are placed on the base member 10.

The stacked bodies 20A and 20B are arranged in the X-direction along the front surface of the base member 10. The stacked bodies 20A and 20B each include a plurality of semiconductor chips CA and a plurality of semiconductor chips CB stacked alternately in a direction crossing the front surface of the base member 10, such as the Z-direction. The stacked bodies 20A and 20B are e.g. resin-molded on the base member 10.

The stacked body 20A includes the lowermost semiconductor chip CA connected to the base member 10. The stacked body 20B includes the lowermost semiconductor chip CB connected to the base member 10.

As shown in FIG. 1A, the semiconductor device 1 further includes a logic chip 30. The logic chip 30 is connected to e.g. the back surface of the base member 10 via a flip-chip bump (hereinafter referred to as FC bump 33).

The base member 10 is e.g. a mounting substrate. The base member 10 includes a connection pad 13, an interconnection 15, and a via-contact 17. The interconnection 15 is provided on the front surface of the base member 10. The connection pad 13 is provided on the back surface of the base member 10. The via-contact 17 extends through the base member 10 from the back surface to the front surface thereof, and electrically connects the connection pad 13 and the interconnection 15.

A semiconductor chip CA of the plurality of semiconductor chips CA and a semiconductor chip CB of the plurality of semiconductor chips CB include via-contacts 21 and 23, respectively. For instance, the via-contacts 21 and 23 are provided so as to extend through each substrate of the semiconductor chips CA and CB from the back surface to the front surface. The via-contacts 21 and 23 are connected to functional layers FLA and FLB (see FIG. 2A) of the semiconductor chips CA and CB, respectively. The semiconductor chips CA and CB are electrically connected to each other through the via-contacts 21 and 23 in each of the stacked bodies 20A and 20B.

As shown in FIG. 1A, the lowermost semiconductor chips CA and CB are electrically connected to the interconnections 15 through e.g. connection bumps 43. That is, the connection bumps 43 connect the via-contacts 21 and 23 of the lowermost semiconductor chips CA and CB to the interconnections 15.

The logic chip 30 is electrically connected to the interconnections 15 through the via-contacts 17 and the connection pads 13 to which the FC bumps 33 are connected. Thereby, the logic chip 30 is electrically connects to the stacked body 20A and the stacked body 20B.

The semiconductor device 1 further includes connection members, such as solder bumps 50, placed on the back surface of the base member 10. The solder bumps 50 are provided on the connection pads 13, respectively, and electrically connected to interconnections 15 through via-contacts 17, respectively. The solder bumps 50 are electrically connected to e.g. other interconnections 15 different from the interconnections 15 that are connected to the stacked bodies 20A and 20B. The solder bumps 50 are connected to e.g. an external circuit. The solder bumps 50 electrically connect the logic chip 30 and the external circuit.

As shown in FIG. 1B, the stacked body 20A is placed so as to overlap a portion of the logic chip 30 when viewed in the Z-direction. The stacked body 20B is placed so as to overlap another portion of the logic chip 30 when viewed in the Z-direction.

For instance, the via-contacts 21 and 23 of the stacked bodies 20A and 20B are placed above the logic chip 30. Thereby, it is possible to connect the stacked bodies 20A and 20B to the logic chip 30 with the shortest distance.

The stacked bodies 20A and 20B each include contacts 21 and 23 arranged in the Z-direction. The functional layer FLA of the semiconductor chip CA and the functional layer FLB of the semiconductor chip CB are electrically connected through the via-contacts 21 and 23 arranged in the Z-direction. Thus, the semiconductor chips CA and CB included in the stacked bodies 20A and 20B are electrically connected to the logic chip 30 and can receive e.g. control commands sent from the logic chip 30.

Figure 2A:
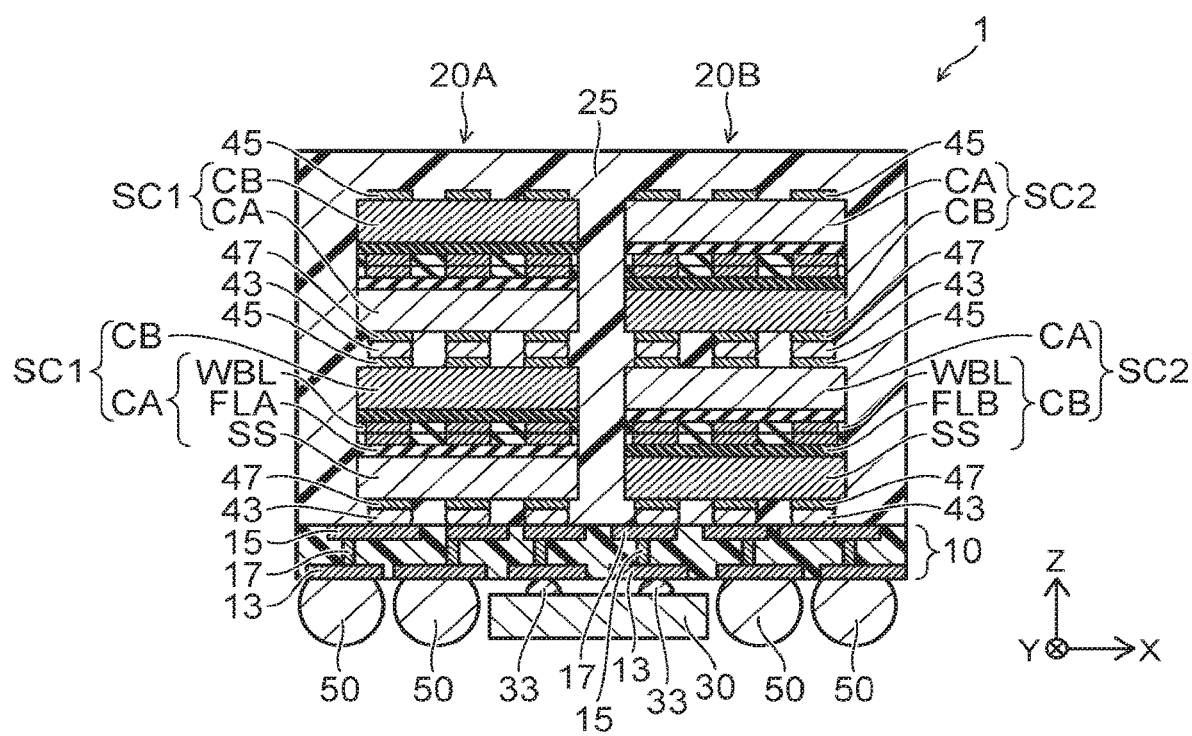
FIGS. 2A and 2B are schematic views showing the configuration of the semiconductor device according to the embodiment.
Figure 2B:
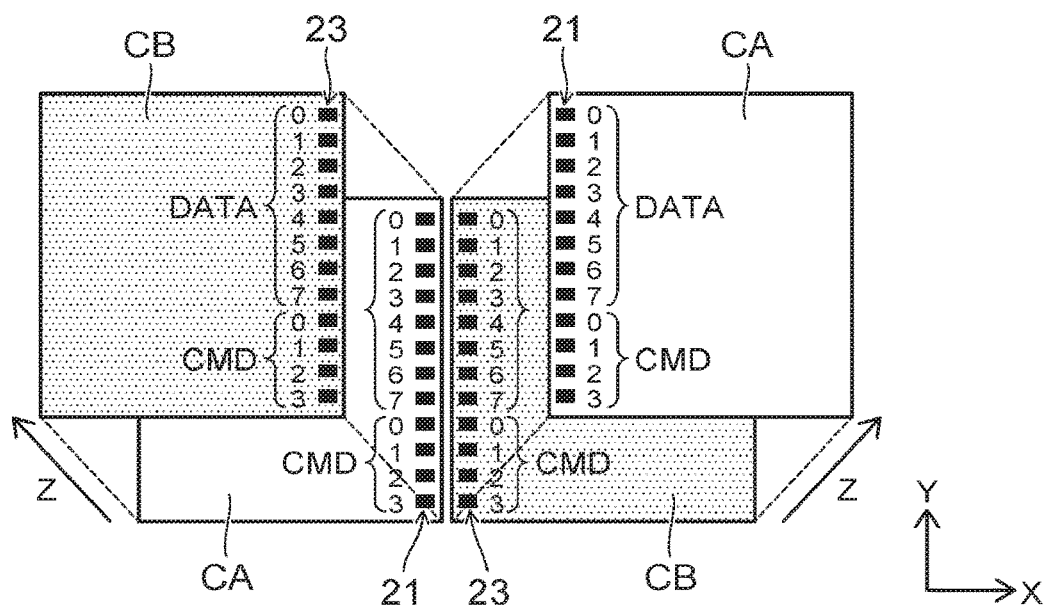

FIGS. 2A and 2B are schematic views showing the configuration of the semiconductor device 1 according to the embodiment. FIG. 2A is a schematic view showing a partial cross-section of the semiconductor device 1. FIG. 2B is a schematic view showing the terminal arrangement of the semiconductor chips CA and CB.

As shown in FIG. 2A, the semiconductor chip CA includes a semiconductor substrate SS, a functional layer FLA, and a bonding layer WBL. The semiconductor chip CB includes a semiconductor substrate SS, a functional layer FLB, and a bonding layer WBL. Connection pads 45 and 47 are provided on the back surfaces of the semiconductor chips CA and CB (i.e., the surfaces opposite to the functional layers FLA and FLB), respectively.

As shown in FIG. 2A, the semiconductor chips CA and CB are bonded so that the bonding layers WBL face each other. The stacked body 20A has a structure in which the stacked chips SC1 are stacked in the Z-direction. Each stacked chip SC1 includes the semiconductor chips CA and CB bonded together. The stacked body 20B has a structure in which the stacked chips SC2 are stacked in the Z-direction. Each stacked chip SC2 includes the semiconductor chips CA and CB bonded together.

The stacked chip SC1 includes connection bumps 43 provided on the back surface of the semiconductor chip CA via connection pads 47. The stacked body 20A is configured so that the back surface of the semiconductor chip CB (the surface opposite to the functional layer FLB) and the back surface of the semiconductor chip CA are connected via the connection bumps 43 and the connection pads 45 and 47.

The stacked chip SC2 includes a connection bump 43 provided on the back surface of the semiconductor chip CB via a connection pad 47. The stacked body 20B is configured so that the back surface of the semiconductor chip CB and the back surface of the semiconductor chip CA are connected via the connection bumps 43 and the connection pads 45 and 47.

The semiconductor chip CA and the semiconductor chip CB are bonded together via the bonding layer WBL. Thus, it is possible to downsize the semiconductor device 1 by reducing the size (height) of the stacked bodies 20A and 20B compared with the case where all the chips are stacked via connection bumps.

It should be noted that the via-contacts 21 and 23 extending through the semiconductor chips CA and CB are omitted in FIG. 2A. The stacked bodies 20A and 20B are each connected to the logic chip 30 and the solder bump 50 through the connection pads 13, the interconnections 15, and the via-contacts 17 of the base member 10.

As shown in FIG. 2B, the semiconductor chips CA and CB each include DATA terminals 0-7 and command (CMD) terminals 0-3. The DATA terminals and the CMD terminals of the semiconductor chip CA are e.g. the via-contacts 21. The DATA terminals and the CMD terminals of the semiconductor chip CB are e.g. the via-contacts 23. The DATA terminals and the CMD terminals of the semiconductor chips CA and CB are connected to the data terminals and the command terminals of the logic chip 30, respectively.

For instance, the DATA terminals and the CMD terminals are arranged in a line along the outer edge in each of the semiconductor chips CA and CB. Moreover, the semiconductor chips CA and CB are placed so that the DATA and CMD terminals of the semiconductor chip CA face the DATA and CMD terminals of the semiconductor chip CB with the shortest distance, respectively. The semiconductor chips CA and CB adjacent in the X-direction each include DATA terminals and CMD terminals arranged along a side surface facing each other. The semiconductor chips CA and CB are placed so that the DATA terminals thereof are arranged in the X-direction, and the CMD terminals thereof are arranged in the X-direction.

Furthermore, in the semiconductor chip CB bonded onto the semiconductor chip CA, the DATA terminals of the semiconductor chip CB are placed at positions capable of being connected to the DATA terminals of the semiconductor chip CA. The CMD terminals of the semiconductor chip CB are placed at positions capable of being connected to the CMD terminals of the semiconductor chip CA. Such a configuration also applies to the semiconductor chip CA bonded onto the semiconductor chip CB.

Thus, the DATA terminals and the CMD terminals are placed in the prescribed regions, respectively, in the stacked bodies 20A and 20B. Thereby, it is possible to facilitate the connection between the logic chip 30 and the stacked bodies 20A and 20B.

Figure 5A:
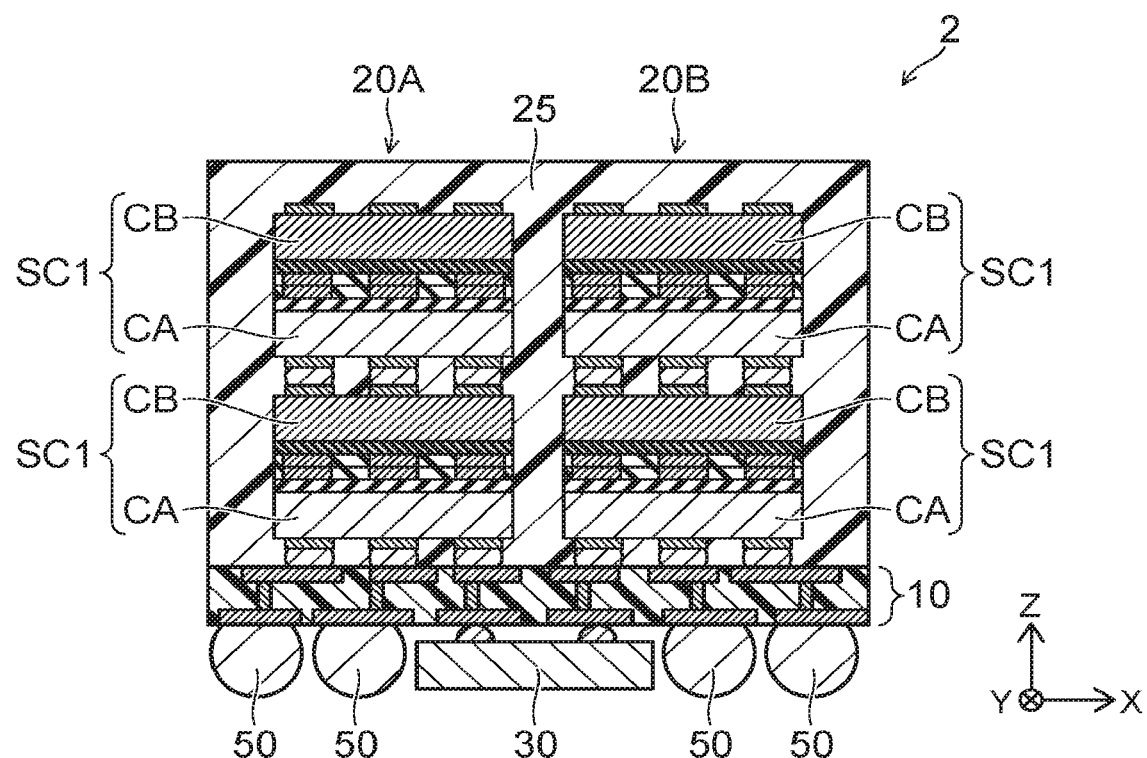
FIGS. 5A and 5B are schematic views showing a semiconductor device according to a comparable example.
Figure 5B:
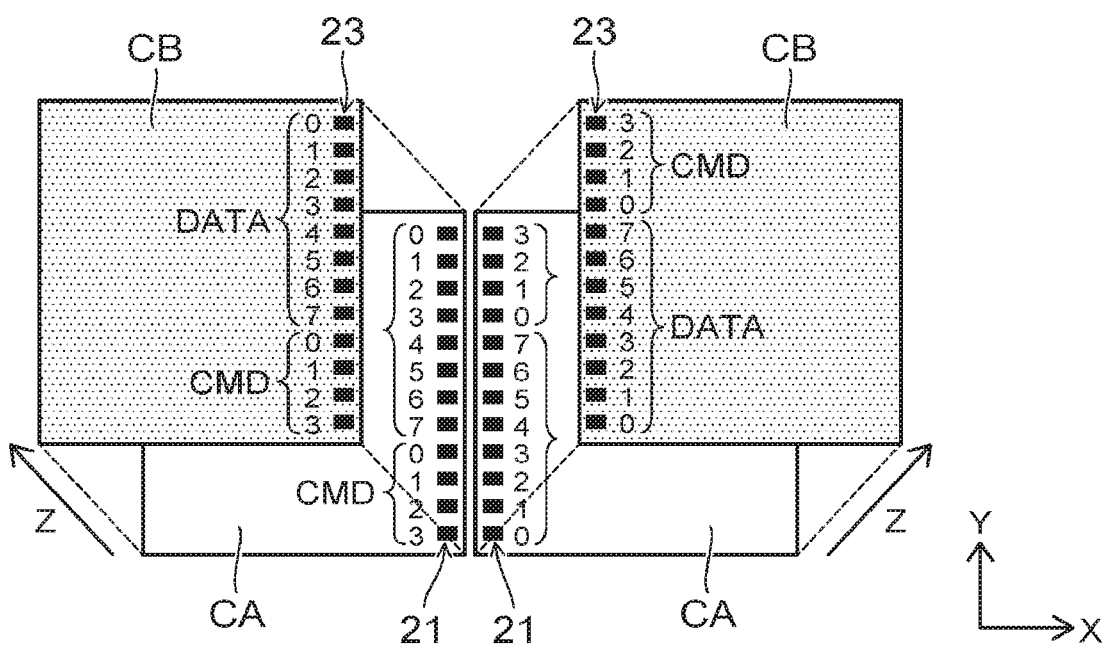

For instance, FIGS. 5A and 5B show a semiconductor device 2. The semiconductor device 2 has a structure in which stacked bodies 20A and 20B are placed on a base member 10, and a logic chip 30 is placed on the back surface of the base member 10. The stacked bodies 20A and 20B each have a structure in which stacked chips SC1 are stacked in the Z-direction. The stacked bodies 20A and 20B are connected to the logic chip 30 through the connection pad 13, the interconnection 15, and the via-contact 17 of the base member 10.

As shown in FIG. 5B, in the semiconductor device 2, the semiconductor chip CA of the stacked body 20A is placed to be adjacent to the semiconductor chip CA of the stacked body 20B in the X-direction, and the semiconductor chip CB of the stacked body 20A is placed to be adjacent to the semiconductor chip CB of the stacked body 20B in the X-direction, so that the DATA and CMD terminals are positioned along the side surfaces facing each other in the X-direction. The arrangements in the Y-direction of the DATA and CMD terminals are inverted each other in the adjacent semiconductor chips in the X-direction. Thereby, the semiconductor device 2 includes regions where some DATA terminals are adjacent to some CMD terminals in the X-direction. Thus, the interconnections connecting the DATA and CMD terminals of the stacked bodies 20A and 20B to the terminals of the logic chip 30 may have a layout more complex than that in the semiconductor device 1 shown in FIG. 2B.

That is, the arrangements of the DATA and CMD terminals in the stacked bodies 20A and 20B cannot be matched with the terminal arrangement of the logic chip 30. Thus, there may be the case where the interconnection 15 in the base member 10 has the layout capable of connecting the DATA and CMD terminals in the stacked bodies 20A and 20B to the terminals of the logic chip 30. Alternatively, the logic chip 30 may be a dedicated chip in which the terminal arrangement is designed to be matched with the arrangement of the DATA and CMD terminals in the stacked bodies 20A and 20B. Such a structure may increase the manufacturing cost of the semiconductor device 2.

In the semiconductor device 1 according to the embodiment, the DATA and CMD terminals of the stacked bodies 20A and 20B can be arranged to be matched with the terminal arrangement of the logic chip 30. Thereby, it is possible to reduce the manufacturing cost of semiconductor device 1.

FIGS. 3A to 3D are schematic sectional views showing the semiconductor chips CA and CB included in the semiconductor device 1 according to the embodiment. For instance, the semiconductor device 1 includes four kinds of semiconductor chips CA1, CA2, CB1, and CB2 when the structures with or without the connection bump 43 are distinguished.

As shown in FIGS. 3A to 3D, the bonding layer WBL includes a bonding pad 51 and an insulating film 53. The bonding pad 51 is electrically connected to e.g. the functional layer FLA or FLB. The insulating film 53 is e.g. a silicon oxide film and protects the functional layer FLA or FLB. The functional layers FLA and FLB include e.g. a memory cell array and a peripheral circuit of a NAND-type memory element.

Figure 3A:
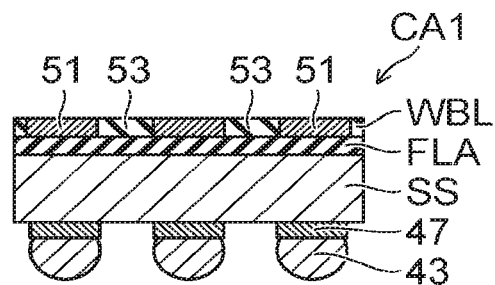
FIGS. 3A to 3D are schematic sectional views showing semiconductor chips included in the semiconductor device according to the embodiment.
Figure 3B:
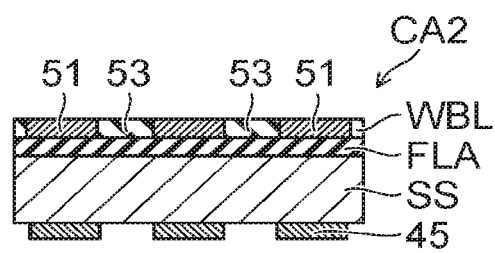
Figure 3C:
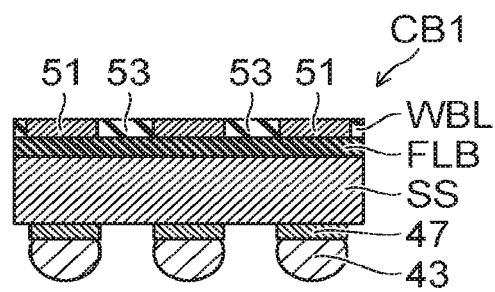
Figure 3D:
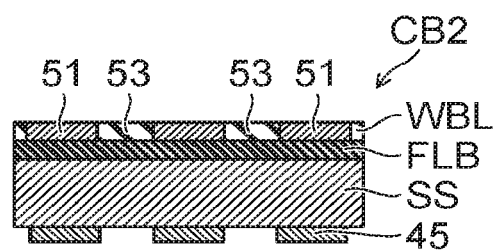

As shown in FIGS. 3A and 3C, the semiconductor chips CA1 and CB1 include a connection bump 43 on the back surface side. On the other hand, the semiconductor chips CA2 and CB2 shown in FIGS. 3B and 3D do not include a connection bump 43 on the back surface side.

The stacked body 20A includes a stacked chip SC1 in which the semiconductor chip CA1 and the semiconductor chip CB2 are bonded together. The stacked body 20B includes a stacked chip SC2 in which the semiconductor chip CA2 and the semiconductor chip CB1 are bonded together.

Next, a method for manufacturing the semiconductor device 1 according to the embodiment is described with reference to FIGS. 4A to 4E. FIGS. 4A to 4E are schematic sectional views sequentially showing the manufacturing processes of the semiconductor device 1. The via-contacts 21 and 23 are omitted also in FIGS. 4A to 4E.

Figure 4A:
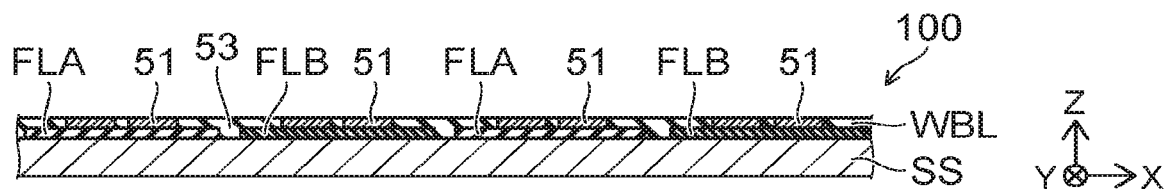
FIGS. 4A to 4E are schematic sectional views showing a method for manufacturing the semiconductor device according to the embodiment.

As shown in FIG. 4A, a wafer 100 is formed, which includes a functional layer FLA and a functional layer FLB. The functional layer FLA and the functional layer FLB are e.g. memory elements formed on a semiconductor substrate SS. The functional layers FLA and the functional layers FLB are placed alternately along the front surface of the semiconductor substrate SS.

Furthermore, a bonding layer WBL is formed to cover the functional layers FLA and FLB. The bonding layer WBL includes e.g. bonding pads 51 and an insulating film 53. The bonding pads 51 are e.g. metal layers containing copper. The insulating film 53 is e.g. a silicon oxide film.

Figure 4B:
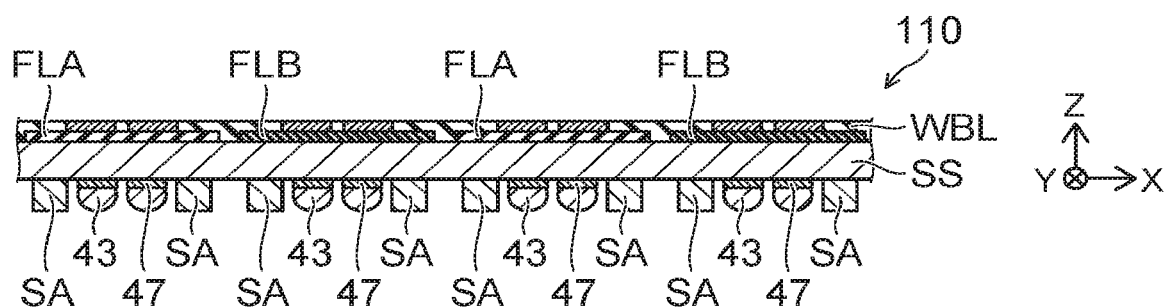

As shown in FIG. 4B, a wafer 110 is formed, which has a connection bumps 43 on the back surface of the semiconductor substrate SS. The wafer 110 has a structure in which connection bumps 43 are formed on the back surface of the wafer 100. The connection bumps 43 are connected to the back surface of the semiconductor substrate SS via e.g. connection pads 47. The connection bumps 43 are formed from a connection member such as a solder material. The connection pads 47 are e.g. metal layers containing copper and the like. The connection bump 43 is not limited to the solder material, but may be formed from a metal material having a melting point lower than a melting point of the connection pad 47.

A spacer SA is formed on the back surface of the semiconductor substrate SS. The spacer SA is e.g. a resin member. The mutual spacing of the stacked chips SC1 or SC2 connected using the connection bump 43 can be kept constant by placing the spacer SA (see FIG. 1A).

Figure 4C:
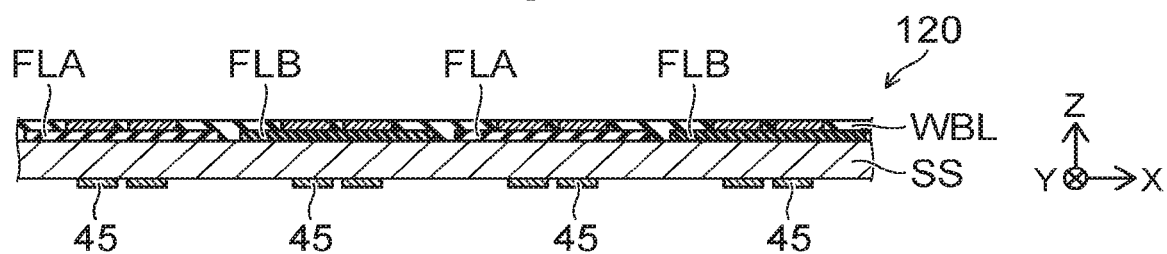

As shown in FIG. 4C, a wafer 120 is formed, which has connection pads 45 on the back surface of the semiconductor substrate SS. The connection pads 45 are e.g. metal layers containing copper and the like. The wafer 120 has a structure in which connection pads 45 are formed on the back surface of the wafer 100.

Figure 4D:
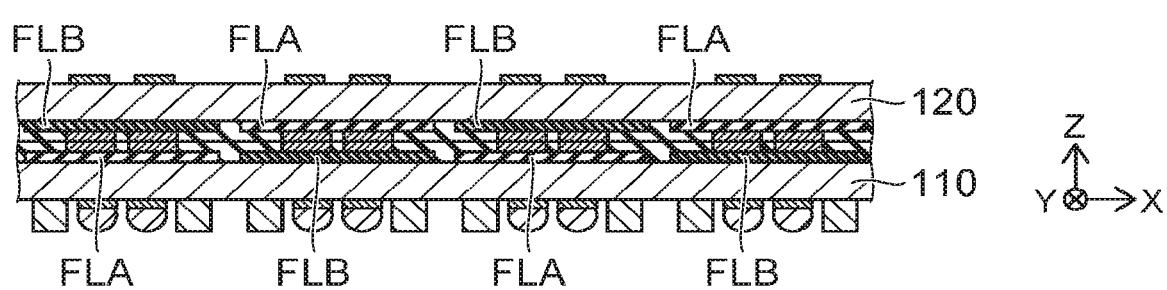

As shown in FIG. 4D, the wafer 110 and the wafer 120 are bonded together. For instance, the bonding layer WBL of the wafer 110 and the bonding layer WBL of the wafer 120 are placed so as to face each other. Then, the wafer 110 and the wafer 120 are brought into contact with each other, and bonded e.g. under pressure and high temperature.

At this time, the bonding pads 51 of the wafer 110 and the bonding pads 51 of the wafer 120 are brought into contact with each other, and the insulating films 53 of the wafers 110 and 120 are brought into contact with each other. Thus, the wafers 110 and 120 are bonded together. The wafers 110 and 120 are bonded such that the functional layer FLA and the functional layer FLB face each other.

Figure 4E:
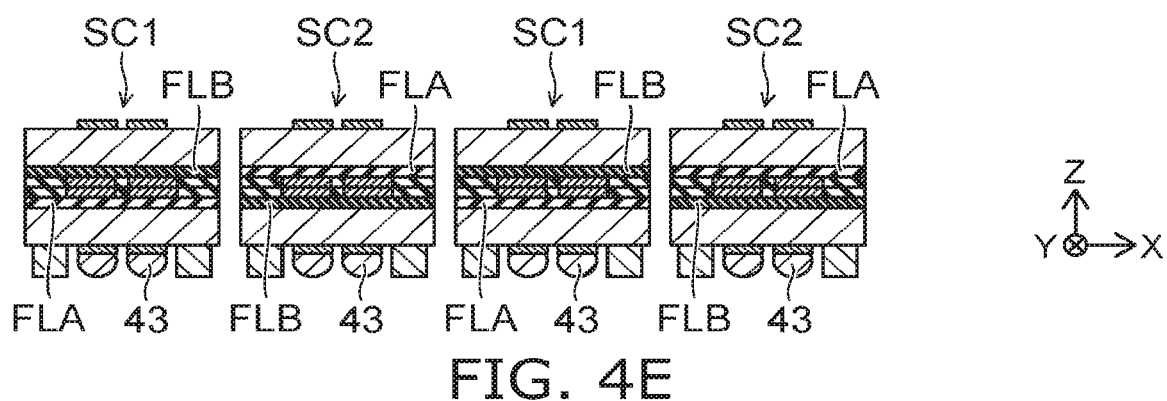

As shown in FIG. 4E, the bonded wafers 110 and 120 are cut using e.g. a dicer to divide into stacked chips SC1 and SC2. Then, a plurality of stacked chips SC1 are stacked on a base member 10 via connection bumps 43 to form a stacked body 20A. In the same manner, a plurality of stacked chips SC2 are stacked via connection bumps 43 to form a stacked body 20B (see FIG. 1A).

In the above manufacturing method, the stacked chips SC1 and SC2 can be formed by bonding such two wafers 100 together in which the functional layer FLA and the functional layer FLB are placed alternately in e.g. at least one direction of the X-direction and the Y-direction. Thereby, the semiconductor device 1 can be manufactured at low cost. For instance, two mask sets may be necessary to manufacture two kinds of wafers, which include the functional layer FLA and the functional layer FLB respectively. In the manufacturing method according to this embodiment, it is possible to manufacture the stacked chips SC1 and SC2 using one mask set.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a base member;
   a first stacked body including first semiconductor chips and second semiconductor chips stacked alternately in a first direction crossing a front surface of the base member; and
   a second stacked body arranged with the first stacked body in a second direction along the front surface of the base member, the second stacked body including other first semiconductor chips and other second semiconductor chips stacked alternately in the first direction, wherein
   the first stacked body includes a lowermost first semiconductor chip connected to the base member,
   the second stacked body includes a lowermost second semiconductor chip connected to the base member,
   the first semiconductor chips and the second semiconductor chips each include a semiconductor substrate and a functional layer provided on the semiconductor substrate, and
   the first stacked body and the second stacked body each include a first bonding part and a second bonding part, the functional layers facing each other and being bonded at the first bonding part, and the semiconductor substrates facing each other and being bonded at the second bonding part.

2. The device according to claim 1, wherein
   the first semiconductor chips and the second semiconductor chips each include a bonding pad provided on the functional layer and a connection pad provided on a back surface of the semiconductor substrate opposite to the functional layer,
   the first bonding part includes bonding pads directly connecting to each other, and
   the second bonding part includes connection pads connecting to each other via a connection member.

3. The device according to claim 2, wherein
   the base member includes a plurality of interconnections placed along the front surface,
   the lowermost first semiconductor chip is connected to one of the plurality of interconnections through a connection pad and a connection member, and
   the lowermost second semiconductor chip is connected to another one of the plurality of interconnections through a connection pad and a connection member.

4. The device according to claim 1, further comprising:
   a third semiconductor chip electrically connected to the first stacked body and the second stacked body, wherein
   the third semiconductor chip includes command terminals and data terminals,
   the first stacked body and the second stacked body each include a first terminal connected to one of the command terminals and a second terminal connected to one of the data terminals,
   the first terminals of the first stacked body and the second stacked body are arranged in the second direction, and
   the second terminals of the first stacked body and the second stacked body are arranged in the second direction.

5. The device according to claim 4, wherein
   the base member includes a plurality of interconnections placed on the front surface, a plurality of connection pads provided on a back surface opposite to the front surface, and via-contacts connecting the plurality of interconnections and the plurality of connection pads, respectively, and
   the third semiconductor chip is placed on the back surface of the base member and connected to at least one of the plurality of connection pads.

6. The device according to claim 5, further comprising:
   a connection bump placed on a back surface side of the base member and attached to a connection pad other than the connection pad connected to the third semiconductor chip.

7. The device according to claim 4, wherein the third semiconductor chip is placed so as to include portions overlapping the first stacked body and the second stacked body, respectively, when viewed in the first direction.

8. The device according to claim 4, wherein
   the first stacked body has a first side surface facing the second stacked body,
   the second stacked body has a second side surface facing the first stacked body,
   the first terminal and the second terminal of the first stacked body are placed along the first side surface, and
   the first terminal and the second terminal of the second stacked body are placed along the second side surface.

9. The device according to claim 4, wherein
   the first semiconductor chip and the second semiconductor chip each include a semiconductor substrate and a via-contact extending through the semiconductor substrate, and
   the first terminal and the second terminal each include a plurality of via-contacts arranged in the first direction.

10. A semiconductor device comprising:
    a base member;
    a first stacked body placed on a front surface of the base member; and
    a second stacked body arranged with the first stacked body on the front surface of the base member, wherein
    the first stacked body and the second stacked body each include a plurality of composite chips stacked in a first direction crossing the front surface of the base member,
    the plurality of composite chips each including a first semiconductor chip and a second semiconductor chip, a front surface of the first semiconductor chip being bonded to a front surface of the second semiconductor chip in each of the plurality of composite chips, the first semiconductor chip and the second semiconductor chip being placed alternately in the first direction in the first stacked body and the second stacked body,
    the first stacked body is connected so that a back surface of the first semiconductor chip faces the base member,
    the second stacked body is connected so that a back surface of the second semiconductor chip faces the base member,
    the first semiconductor chip and the second semiconductor chip each include a semiconductor substrate and a functional layer provided on a front surface of the semiconductor substrate,
    the plurality of composite chips each includes a first functional layer of the first semiconductor chip and a second functional layer of the second semiconductor chip bonded to each other, and the plurality of composite chips are stacked in the first direction and connected via a connection member placed between back surfaces of semiconductor substrates.

11. The device according to claim 10, wherein
the first semiconductor chip includes a first bonding pad exposed at a surface of the first functional layer,
the second semiconductor chip includes a second bonding pad exposed at a surface of the second functional layer, and
the composite chip includes the first bonding pad and the second bonding pad being in contact with each other at a bonding interface.

12. The device according to claim 10, wherein
the first semiconductor chip includes a first via-contact extending from a back surface to a front surface of a first semiconductor substrate,
the second semiconductor chip includes a second via-contact extending from a back surface to a front surface of a second semiconductor substrate, and
the composite chip includes the first via-contact and the second via-contact aligned in the first direction.

13. The device according to claim 12, wherein the first via-contact and the second via-contact are electrically connected through the first functional layer of the first semiconductor chip and the second functional layer of the second semiconductor chip.

14. The device according to claim 12, wherein the first stacked body and the second stacked body each include the plurality of first via-contacts and second via-contacts arranged alternately in the first direction.

15. The device according to claim 14, further comprising:
a third semiconductor chip placed below the first stacked body and the second stacked body,
wherein the third semiconductor chip is electrically connected to the plurality of first via-contacts and second via-contacts arranged alternately in the first direction.

16. A semiconductor device comprising:
a base member;
a first stacked body including first semiconductor chips and second semiconductor chips stacked alternately in a first direction crossing a front surface of the base member;
a second stacked body arranged with the first stacked body in a second direction along the front surface of the base member, the second stacked body including other first semiconductor chips and other second semiconductor chips stacked alternately in the first direction; and
a third semiconductor chip electrically connected to the first stacked body and the second stacked body, the third semiconductor chip including command terminals and data terminals, wherein
the first stacked body includes a lowermost first semiconductor chip connected to the base member,
the second stacked body includes a lowermost second semiconductor chip connected to the base member,
the first stacked body and the second stacked body each include a first terminal connected to one of the command terminals and a second terminal connected to one of the data terminals,
the first terminals of the first stacked body and the second stacked body are arranged in the second direction, and
the second terminals of the first stacked body and the second stacked body are arranged in the second direction.

17. The device according to claim 16, wherein
the first semiconductor chips and the second semiconductor chips each include a semiconductor substrate and a functional layer provided on the semiconductor substrate,
the first semiconductor chips and the second semiconductor chips each include a bonding pad provided on the functional layer and a connection pad provided on a back surface of the semiconductor substrate opposite to the functional layer,
the first stacked body and the second stacked body each include a first bonding part and a second bonding part, the functional layers facing each other and being bonded at the first bonding part, and the semiconductor substrates facing each other and being bonded at the second bonding part,
the first bonding part includes bonding pads directly connecting to each other, and
the second bonding part includes connection pads connecting to each other via a connection member.

18. The device according to claim 16, wherein
the base member includes a plurality of interconnections placed on the front surface, a plurality of connection pads provided on a back surface opposite to the front surface, and via-contacts connecting the plurality of interconnections and the plurality of connection pads, respectively,
the third semiconductor chip is placed on the back surface of the base member and connected to at least one of the plurality of connection pads, and
the device further comprises a connection bump placed on a back surface side of the base member and attached to a connection pad other than the connection pad connected to the third semiconductor chip.

19. The device according to claim 16, wherein
the first stacked body has a first side surface facing the second stacked body,
the second stacked body has a second side surface facing the first stacked body,
the first terminal and the second terminal of the first stacked body are placed along the first side surface,
the first terminal and the second terminal of the second stacked body are placed along the second side surface, and
the third semiconductor chip is placed so as to include portions overlapping the first stacked body and the second stacked body, respectively, when viewed in the first direction.

20. The device according to claim 16, wherein
the first semiconductor chip and the second semiconductor chip each include a semiconductor substrate and a via-contact extending through the semiconductor substrate, and
the first terminal and the second terminal each include a plurality of via-contacts arranged in the first direction.

* * * * *